(12) United States Patent
Barth, Jr. et al.

(10) Patent No.: US 6,791,348 B2
(45) Date of Patent: Sep. 14, 2004

(54) DIGITAL OVERCURRENT TEST

(75) Inventors: John Edward Barth, Jr., Williston, VT (US); Paul Christian Parries, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 10/208,339

(22) Filed: Jul. 29, 2002

(65) Prior Publication Data

US 2004/0017218 A1 Jan. 29, 2004

(51) Int. Cl.[7] ............................................. G01R 31/02
(52) U.S. Cl. ................................. 324/763; 324/158.1
(58) Field of Search ............................. 324/73.1, 763, 324/765, 158.1; 365/201, 233, 236

(56) References Cited

U.S. PATENT DOCUMENTS

| | | | | | |
|---|---|---|---|---|---|
| 5,381,373 | A | * | 1/1995 | Ohsawa | 365/201 |
| 6,462,996 | B2 | * | 10/2002 | Ooishi | 365/201 |
| 6,577,547 | B2 | * | 6/2003 | Ukon | 365/201 |

* cited by examiner

*Primary Examiner*—Minh N. Tang
(74) *Attorney, Agent, or Firm*—Ira D. Blecker

(57) ABSTRACT

An integrated circuit having a charge pump is tested for excessive current draw by counting the number of times the charge pump cycles in a test interval, storing the result in a register that is used for another purpose during operation and comparing the result with a reference number representing acceptable leakage, thereby identifying latent defects that may become a cause of failure as well as short circuits.

11 Claims, 1 Drawing Sheet

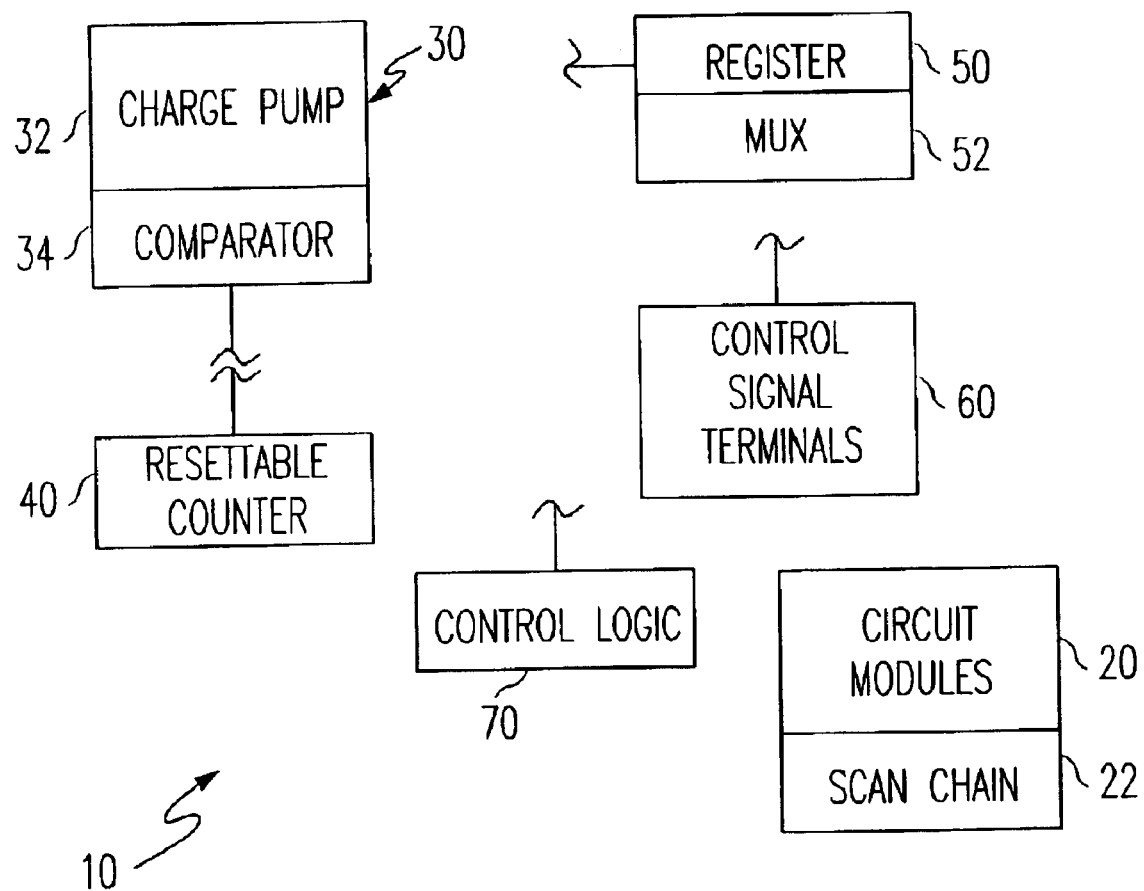

DIGITAL OVERCURRENT TEST

TECHNICAL FIELD

The field of the invention is that of testing integrated circuits having on-chip power supplies.

BACKGROUND OF THE INVENTION

Testing integrated circuits, has become both more difficult and more important as the complexity of the circuits has increased.

The amount of resources spent in conventional burn-in and functional margin testing accounts for a non-trivial fraction of chip manufacturing cost. Sending a chip through a thermal cycle and testing it with a highly expensive automated tester is an expense that can be avoided if the chip can be eliminated by a less expensive method.

In addition, there is a class of latent defects that do not show up as fatal flaws in a conventional test, but have a high probability of causing the chip to fail.

In the past, excessive current draw has been tested by applying a voltage to the module or chip through a resistor and measuring the voltage drop across the test resistor. This procedure requires extra wiring on the chip that consumes space.

The art could benefit from a simple and inexpensive testing technique adapted to identify chips with a high probability of failing.

SUMMARY OF THE INVENTION

The invention relates to integrated circuits having an on-chip current measurement for identifying circuits that draw current above their design specifications.

A feature of the invention is use of charge pumps present on the chip.

Another feature of the invention is a digital measurement of current draw by counting cycles of the charge pump.

Another feature of the invention is the use of circuit elements already present in the chip for testing.

BRIEF DESCRIPTION OF THE DRAWINGS

The sole FIGURE illustrates schematically a testing system according to the invention.

DETAILED DESCRIPTION

The FIGURE illustrates schematically an integrated circuit 10 according to the invention having a set of circuit modules that perform the function of the chip.

At least one of these modules is powered by an on-chip power supply 30 including charge pump 32 and comparator 34. Conventionally, comparator 34 compares the voltage on the module or network being supplied by the charge pump and starts and stops the pump as required to maintain the voltage within a specified tolerance.

According to the invention, the comparator is used as a test element by counting the number of times the pump cycles within some interval. Counter 40 responds to any convenient control signal (e.g. the output from comparator 34). At the end of a test interval, the sum in counter 40 is transferred through optional multiplexer 52 to register 50. Optional multiplexer 52 and associated wiring, etc. that are used for transfer of the data will be referred to as transfer means.

The number in register 50, which is attached to terminals on the chip, is read by an external tester and compared with a reference that has been determined empirically to represent maximum acceptable leakage. Optionally, box 50 represents only the terminals, in which case transferring the sum is just providing a current path between the counter and the terminals. This option may be used if it is more convenient to construct counter 40 to hold the data. Conventional multiplexers 52 will be used to permit sharing the register structure and/or terminals with elements of the circuit that are used during normal operation.

The magnitude of the counting interval does not matter because the empirical number will be set appropriately before volume production begins (and may be changed in response to data from the field).

Preferably, counter 40 will be started and stopped in response to externally applied control signals on terminals 60, so that there is no need to provide a timer on-chip. In that case, the means for starting and stopping the counter will just be a wire between a terminal and the counter. Box 60 represents terminals and multiplexers to share the terminals with interconnections that are used during normal operation. Box 60 also represents registers as required to hold control signals.

In a particular example, the circuit modules represented schematically by box 20 include a logic circuit that contains an embedded DRAM array, such as a micro-controller or microprocessor. The DRAM array has a scan chain connected to it for testing, as known in the art, with register 50 being the register that contains the output of the scan chain during testing of the array. Terminals 60 may be the address terminals for the memory array, the terminals for input or output data, etc, as is convenient.

Counter 40 may be shared between two or more charge pumps, if the wiring between the counter and the pumps takes up less room than a separate counter. The control logic represented by box 70 will then connect the counter to the appropriate charge pump as required.

Those skilled in the art will readily be able to implement the present invention in the light of the disclosure herein, using conventional implementations of charge pumps, counters, registers and the like.

While the invention has been described in terms of a single preferred embodiment, those skilled in the art will recognize that the invention can be practiced in various versions within the spirit and scope of the following claims.

What is claimed is:

1. An integrated circuit having at least one circuit module connected to at least one on-chip power supply, said on-chip power supply containing a charge pump, and comparison means for controlling operation of said charge pump in response to current leakage from said circuit module;
    resettable counter means for counting the number of times said charge pump turns on;
    means for resetting said counter means; and
    transfer means for transferring the sum of said counter means.

2. An integrated circuit according to claim 1, further comprising control logic for starting and resetting said counter means and for transferring said sum of said counter means from said counter means to a register.

3. An integrated circuit according to claim 2, further comprising a set of control signal terminals connected to said control logic for receiving control signals from an off-chip test system.

4. An integrated circuit according to claim 2, further comprising multiplexer means for controllably directing one of said sum of said counter means and other data to said register.

5. An integrated circuit according to claim 3, further comprising multiplexer means for controllably directing one of said sum of said counter means and other data to a register.

6. An integrated circuit according to claim 2, further comprising at least two charge pumps, in which said control logic includes means for selectively activating individual charge pumps, counting cycles in a selected charge pump and holding a sum of counted cycles in a register.

7. A method of testing an integrated circuit having at least one circuit module connected to at least one on-chip power supply, said on-chip power supply containing a charge pump, and comparison means for controlling operation of said charge pump in response to current leakage from said circuit module, comparing the steps of;

resetting a counter and counting the number of times said charge pump turns on in a test interval.

8. A method according to claim 7, in which said counter is controlled by applying control signals from an external source to control signal terminals in said integrated circuit.

9. A method according to claim 8, in which said integrated circuit contains at least two charge pumps and in which control logic activates a selected pump, resets said counter, and transfers said sum to said register in response to control signals applied to said control signal terminals.

10. A method according to claim 8, in which said integrated circuit contains multiplexer means for controllably directing one of said sum of said counter and other data to said register.

11. A method according to claim 7, in which said integrated circuit contains multiplexer means for controllably directing one of said sum of said counter and other data to said register.

\* \* \* \* \*